(12) United States Patent
Koechlin et al.

(10) Patent No.: US 8,957,738 B1
(45) Date of Patent: Feb. 17, 2015

(54) VOLTAGE CONTROLLED OSCILLATOR

(71) Applicant: Hittite Microwave Corporation, Chelmsford, MA (US)

(72) Inventors: Michael Koechlin, Chelmsford, MA (US); John Chiesa, Pelham, NH (US); Christopher O'Neill, Chelmsford, MA (US); Ekrem Oran, Nashua, NH (US); John Poelker, Andover, MA (US); Cemin Zhang, Nashua, NH (US)

(73) Assignee: Hittite Microwave Corporation, Chelmsford, MA (US)

( * ) Notice: Subject to any disclaimer, the term of this patent is extended or adjusted under 35 U.S.C. 154(b) by 104 days.

(21) Appl. No.: 13/654,846

(22) Filed: Oct. 18, 2012

(51) Int. Cl.
*H03B 5/12* (2006.01)
*H03L 7/00* (2006.01)

(52) U.S. Cl.
CPC ....................................... *H03L 7/00* (2013.01)
USPC ..................... 331/117 R; 331/167; 331/177 V (58) Field of Classification Search
CPC ...... H03B 5/12; H03B 5/1203; H03B 5/1206; H03B 5/1218; H03B 5/1225; H03B 5/1231; H03B 5/124; H03B 5/1243; H03B 5/1293; H03B 2200/0008; H03B 2200/0028; H03B 2200/0034; H03B 2200/004; H03B 2200/007; H03B 2200/0092; H03B 2201/0208
USPC ............ 331/117 R, 117 FE, 167, 177 V, 36 C
See application file for complete search history.

(56) References Cited

U.S. PATENT DOCUMENTS

| 4,536,724 A * | 8/1985 | Hasegawa et al. ......... 331/177 V |
| 4,621,241 A * | 11/1986 | Kiser ......................... 331/117 R |
| 6,801,097 B2 * | 10/2004 | Wallace ......................... 331/179 |
| 2012/0313719 A1 * | 12/2012 | Kawasaki ..................... 331/115 |

OTHER PUBLICATIONS

Chen et al., "A Low-Power Ka-Band Voltage-Controlled Oscillator Implemented in 200-GHz SiGe HBT Technology", Microwave Theory and Techniques, IEEE Transactions on 53.5 (2005): 1672-1681.*

* cited by examiner

*Primary Examiner* — Ryan Johnson
(74) *Attorney, Agent, or Firm* — Knobbe, Martens, Olson & Bear, LLP (57) ABSTRACT

A voltage controlled oscillator including an RF output terminal and a DC control terminal, an active circuit, and a resonant circuit interconnected with the active circuit and including a plurality of series resonators each having an electrically variable capacitance and fixed inductor; the active circuit includes at least one transistor having an operating current density which is approximately 35% or less of the peak $f_T$ operating current density and/or the active circuit includes a multi-transistor bank disposed in at least two separate sections, each pair of sections spaced apart to provide improved thermal uniformity among the transistors without substantially increasing parasitic impedance among them for providing an improved lower phase noise output at said RF output terminal.

49 Claims, 11 Drawing Sheets

Bonding diagram of Die in surface mount package

VOLTAGE CONTROLLED OSCILLATOR

FIELD OF THE INVENTION

This invention relates to an improved voltage controlled oscillator, and more particularly to such an oscillator having a resonator circuit with a plurality of series resonators.

BACKGROUND OF THE INVENTION

There are many applications in which it is desirable have a voltage controlled oscillator with low phase noise. In some applications, in order to reduce the number of oscillators required to cover a given frequency band, it is desirable for the oscillator to have low phase noise over a wide tuning range.

Voltage controlled oscillators are known in the art. One conventional voltage controlled oscillator includes an LC resonator consisting of two back to back series varactor diodes and a single resonant inductor. Frequency control is achieved by applying a DC voltage through a bias choke connected at the junction of the varactor diodes common cathode. One disadvantage of this voltage controlled oscillator is that a high frequency voltage applied to the resonator is applied across just two varactor diodes. When attempting to cover a wide frequency bandwidth it is desirable to utilize the full DC control voltage range. Therefore, the DC control voltage may be selected to be a low voltage in the range. At a low DC control voltage the varactor capacitance will change significantly and nonlinearly for a small change in DC control voltage. Then, when a high frequency voltage is applied across the two varactor diodes at this low DC control voltage, it results in a nonlinear modulation of the desired oscillator signal and consequently degraded phase noise. U.S. Pat. No. 4,536,724 relates to a prior art voltage controlled oscillator which includes multiple electrically tunable varactor diodes arranged in a matrix that along with a single inductor forms an LC resonant circuit. An advantage of that oscillator is that a high frequency voltage applied to the resonator is distributed equally among a plurality of series back to back varactor elements resulting in relatively less high frequency voltage applied across each diode in the matrix. One disadvantage of that voltage controlled oscillator is that at high frequencies the parasitic capacitances and inductances associated with the physical realization of the varactor diode matrix greatly reduces its frequency tuning bandwidth.

Further attempts to improve performance have included using resonant circuits with a plurality of series resonators each resonator employing distributed inductance and capacitance. The inductors are often fixed and the capacitances are variable and implemented with e.g. electrically variable capacitances such as varactors. Such devices provide improved results with lower phase noise but still more improvement is desirable.

SUMMARY OF THE INVENTION

It is therefore an object of this invention to provide an improved voltage controlled oscillator.

It is a further object of this invention to provide such an improved voltage controlled oscillator with increased frequency tuning bandwidth.

It is a further object of this invention to provide such an improved voltage controlled oscillator with improved, flatter, phase noise performance over a wide tuning range.

It is a further object of this invention to provide such an improved voltage controlled oscillator in which the active circuit operates at a current density substantially below the peak transition frequency, $f_T$, transistor current density.

It is a further object of this invention to provide such an improved voltage controlled oscillator in which a multi-transistor bank is segmented into two or more sections with sufficient separation among sections to provide improved thermal stability among the transistors without substantially increasing parasitic impedances among them.

The invention results from the realization that an improved voltage controlled oscillator can be achieved by connecting a plurality of series resonators, each with electrically variable capacitances and fixed inductors, in a feedback arrangement with an active device thereby reducing the high frequency voltage across each of the variable capacitances in each of the series resonators compounded with a reduction in current density substantially below that of the peak transition frequency, $f_T$, transistor current density and/or the separation into sections of a multi-transistor bank to provide improved thermal stability among the transistors without substantially increasing parasitic impedance among them. The reduced high frequency voltage across each variable capacitance results in reduced nonlinear modulation of the resonator capacitance and provides for improved, flatter, phase noise performance versus oscillator tuning voltage. Furthermore, the use of a plurality of series electrically tunable resonators results in an increase in the resonator's rate of reactance change versus frequency. The increased rate of reactance change versus frequency allows the oscillator to tune over a wider frequency range and results in increased tuning bandwidth.

This invention features a voltage controlled oscillator including an RF output terminal and a DC control terminal, an active circuit, and a resonant circuit interconnected with the active circuit and including a plurality of series resonators each having an electrically variable capacitance and fixed inductor. The active circuit includes at least one transistor having an operating current density which is approximately 35% or less of the peak $f_T$ operating current density for providing an improved lower phase noise output at the RF output terminal.

In one embodiment there may be three series resonators each having a variable capacitance and a fixed inductor. There may be four series resonators each having a variable capacitance and a fixed inductor. There may be five series resonators each having a variable capacitance and a fixed inductor. The voltage controlled oscillator may further include an inductance coupled in series between the DC control terminal and each of the electrically variable capacitances to adjust the frequency of the oscillator. The voltage controlled oscillator may further include an inductance and resistance coupled in series between the DC control terminal and each of the electrically variable capacitances to adjust the frequency of the oscillator. The inductance may be coupled to the electrically variable capacitances at a point of RF voltage minimum. Each of the electrically variable capacitances may include a varactor. Each of the varactors may include two diodes coupled together. Each of the varactors may include only one diode. The voltage controlled oscillator may be implemented on a planar monolithic substrate. The monolithic substrate may be selected from the group GaAs and Si. Each of the varactors may include a p-n junction. Each of the varactors may include a field effect transistor (FET) and may include a capacitance between the gate and a source of the FET. Each electrically variable capacitance may include a ferroelectric based capacitance. Each varactor may include a MEMs based capacitance. Each varactor may include a switchable capacitor. The resonant circuit and active circuit may be configured as single ended oscillator. The monolithic substrate may be disposed in a surface mount package. The resonant circuit and active circuit may be configured as a push-push oscillator. The resonant circuit and active circuit may be configured as a series tuned Colpitts oscillator. The active circuit may include a bipolar transistor. The active circuit may include a field effect transistor.

This invention also features a voltage controlled oscillator including a RF output terminal and a DC control terminal, an active circuit, and a resonant circuit interconnected with the active circuit and including a plurality of series resonators each having an electrically variable capacitance and fixed inductor. The active circuit includes a multi-transistor bank disposed in at least two separate sections, each pair of sections being spaced apart to provide improved thermal uniformity among the transistors without substantially increasing parasitic impedance among them for providing an improved lower phase noise output at the RF output terminal.

In one embodiment there may be three series resonators each having a variable capacitance and a fixed inductor. There may be four series resonators each having a variable capacitance and a fixed inductor. There may be five series resonators each having a variable capacitance and a fixed inductor. The sections may be spaced apart approximately 200-500µ from section center to center. The sections may include bipolar transistors and are connected in common emitter configuration. The sections may include bipolar transistors and may be spaced 215µ from section center to center with the transistor bank made with the GaAs HBT process. The voltage controlled oscillator may further include an inductance coupled in series between the DC control terminal and each of the electrically variable capacitances to adjust the frequency of the oscillator. The voltage controlled oscillator may further include an inductance and resistance coupled in series between the DC control terminal and each of the electrically variable capacitances to adjust the frequency of the oscillator. The inductance may be coupled to the electrically variable capacitance at a point of RF voltage minimum. Each of the electrically variable capacitances may include a varactor. Each of the varactors may include two diodes coupled together. Each of the varactors may include only one diode. The voltage controlled oscillator may be implemented on a planar monolithic substrate. The monolithic substrate may be selected from the group GaAs and Si. Each of the varactors may include a p-n junction. Each of the varactors may include a field effect transistor (FET) and may include a capacitance between the gate and a source of the FET. Each electrically variable capacitance may include a ferroelectric based capacitance. Each varactor may include a MEMs based capacitance. Each varactor may include a switchable capacitor. The resonant circuit and active circuit may be configured as a single ended oscillator. The monolithic substrate may be disposed in a surface mount package. The resonant circuit and active circuit may be configured as a push-push oscillator. The resonant circuit and active circuit may be configured as a series tuned Colpitts oscillator. The active circuit may include a bipolar transistor. The active circuit may include a field effect transistor.

This invention also features a voltage controlled oscillator including an RF output terminal and a DC control terminal, an active circuit, and a resonant circuit interconnected with the active circuit and including a plurality of series resonators each having an electrically variable capacitance and fixed inductor, the active circuit including at least one transistor having an operating current density which is approximately 35% or less of the peak $f_T$ operating current density. The active circuit further includes a multi-transistor bank disposed in at least two separate sections, each pair of sections spaced apart to provide improved thermal uniformity among the transistors without substantially increasing parasitic impedance among them which provide an improved lower phase noise output at the RF output terminal.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

The invention may be accomplished with a voltage controlled oscillator including: an output terminal; an active device coupled to the output terminal; a resonator circuit containing at least two electrically tunable LC resonators with each resonator including a tunable resonator capacitance and a fixed resonator inductor and a frequency control terminal coupled by bias chokes to the tunable resonator capacitances of the resonating circuits to adjust the output frequency of the voltage controlled oscillator.

The voltage controlled oscillator may be a series tuned Colpitts oscillator. The plurality of tunable resonators may include three tunable LC resonators each with a variable resonator capacitance and a fixed resonator inductor. The variable resonator capacitances may be varactors. The frequency control terminal may be coupled to each of the varactors through one or more bias chokes.

The voltage controlled oscillator may be a push-push (x2 frequency) series tuned Colpitts oscillator. Each active device may be made of a bank of transistors segmented into two sections e.g. with a center to center spacing of 215 micrometers. Each active device may be operated at a low current density, e.g., 15%-35% of peak transition frequency, $f_T$, current density. The plurality of tunable resonators may include five tunable LC resonators each with a variable resonator capacitance and a fixed resonator inductor. The variable resonator capacitances may be varactors. One or more frequency control terminals may be coupled to each of the varactors through one or more bias chokes. The output may be taken from a buffer amplifier used to provide isolation from the output to the active device circuit.

Each of the varactors may include two diodes coupled together or only one diode. The voltage controlled oscillator may be implemented on a planar monolithic substrate. The monolithic substrate may be selected from the group of GaAs and Si. The varactors may include p-n junctions. The varactors may include a field effect transistor (FET) and use a capacitance between a gate and the source/-drain electrode of the FET. The varactor may include a MOS device. The varactor may include one or more switched capacitances. The varactor may include a ferroelectric based capacitance. Each varactor may include one or more MEMS-based capacitances. The monolithic substrate may be mounted in a surface-mount package and may be made by the GaAs HBT process.

Figure 1:
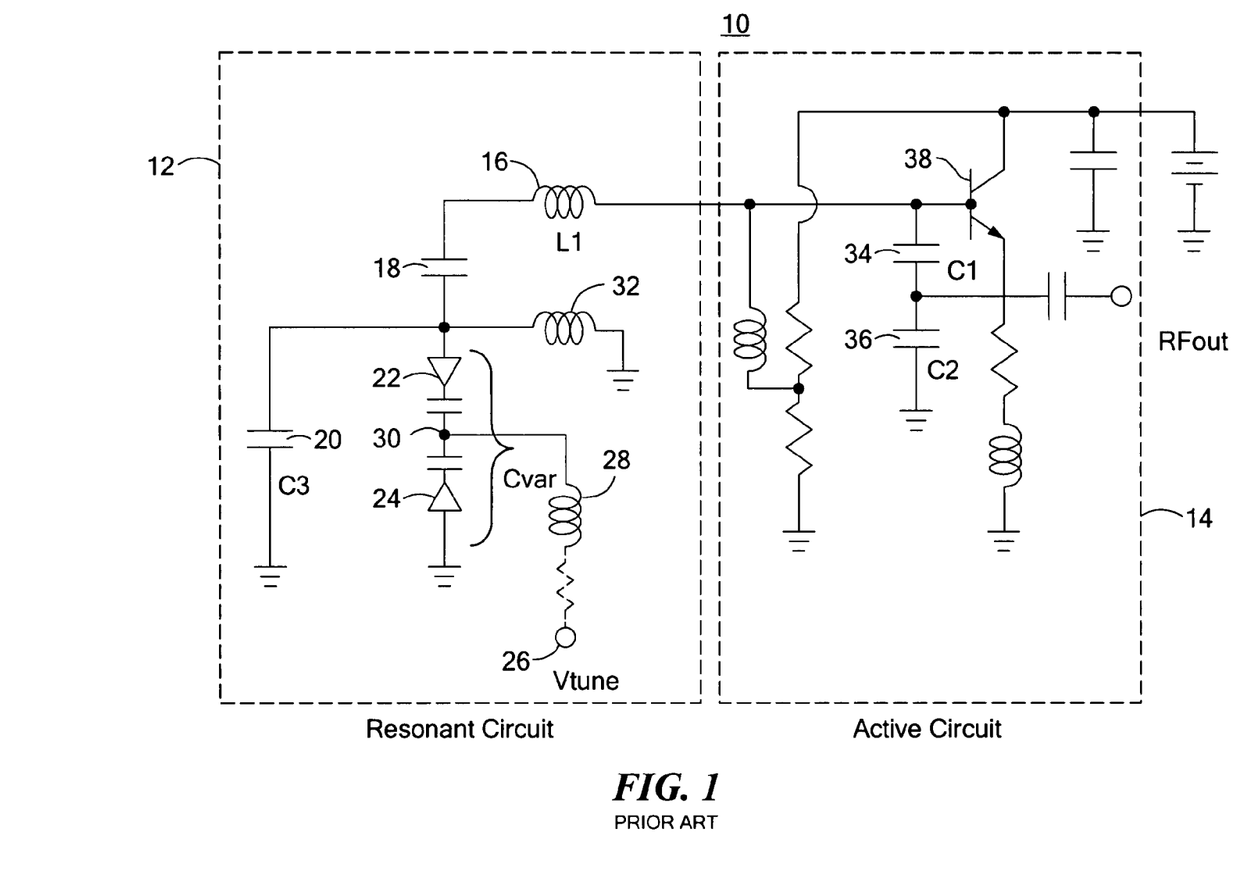
FIG. 1 is a schematic diagram showing a prior art single ended voltage controlled oscillator using a lumped inductance and capacitance series resonator.

There is shown in FIG. 1 a prior art voltage controlled oscillator 10 including a tunable LC resonant circuit 12 and active circuit 14. Resonant circuit 12 includes a fixed inductor 16, coupling capacitance 18, fixed capacitance 20, and two back to back connected varactor diodes 22 and 24. A DC control voltage is applied at terminal 26 through bias choke 28 to the junction 30 of the common varactor diode cathodes. Second bias choke 32 has one side connected to ground and provides a voltage reference for the anode of varactor diode 22. Fixed capacitance 20 is connected in parallel to the varactor diodes 22 and 24 to adjust the tuning sensitivity of the voltage controlled oscillator. Fixed capacitance 20 may be omitted if unnecessary. Active circuit 14 may be in the nature of a Colpitts style oscillator with capacitances 34 and 36 providing a voltage divider to ground for the base of transistor 38 which in this case is a bipolar transistor. The ratio of capacitances 34-36 determines the negative resistance of active circuit 14. The negative resistance of the active circuit 14 must be greater in an absolute sense than the positive resistance seen looking into the resonant circuit 12. In resonant circuit 12 the ratio of capacitance 20 to the varactors determines how sensitive the tuning will be. Inductors 28 and 32 provide DC bias or ground reference while attempting to provide very high impedance at RF frequencies. One disadvantage of the voltage controlled oscillator 10 of FIG. 1 is that a high frequency voltage is applied to the resonator across just two varactor diodes.

Figure 2:
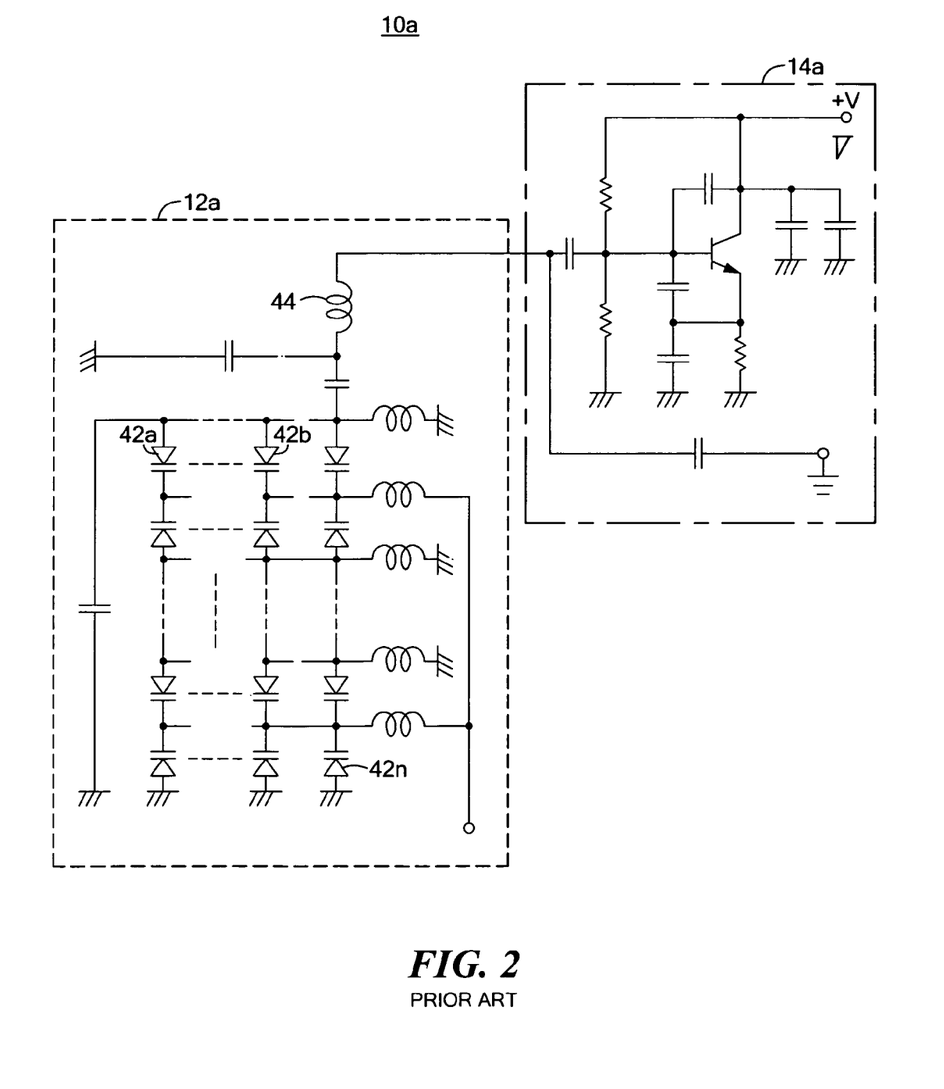
FIG. 2 is a schematic diagram of another prior art single ended voltage controlled oscillator using series resonators but with only distributed capacitance.

Another prior art single ended voltage controlled oscillator 10a, FIG. 2, includes a plurality of electrically tunable capacitances and in this case, varactor diodes 42a-n connected in common cathode pairs. These varactor diodes 42a-n are arranged in a matrix, and, in conjunction with a single inductance 44, form the LC resonant circuit 12a. Thus there is a distributed electrically variable capacitance in this approach but only a single non-distributive inductance 44. This does not work well at high frequencies: the parasitic capacitance associated with the physical implementation of the varactor diode matrix reduces the frequency tuning bandwidth of the voltage controlled oscillator.

Figure 3:
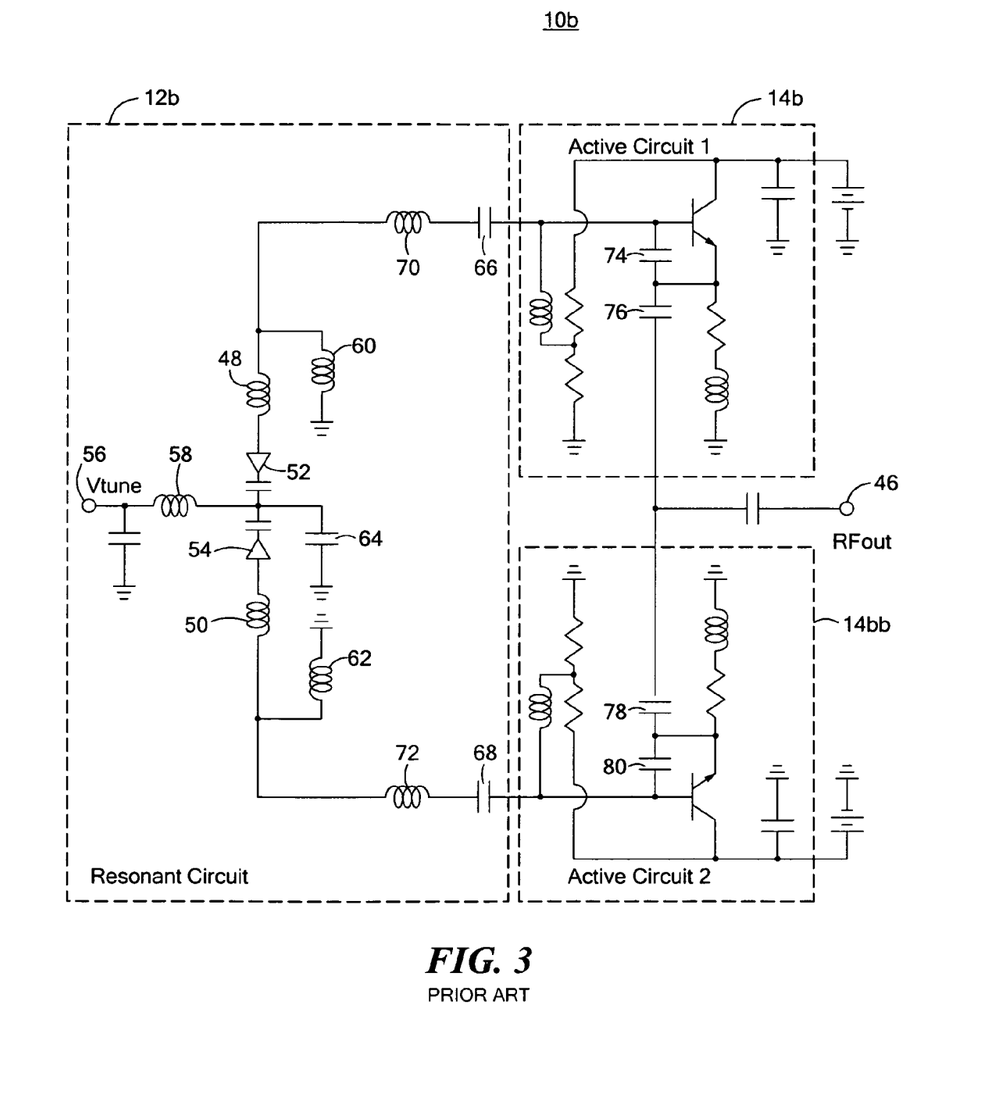
FIG. 3 is a schematic diagram of yet another prior art push-push (x2 frequency) series tuned Colpitts voltage controlled oscillator using a distributed inductance and capacitance series resonator.

Yet another prior art controlled oscillator 10b, FIG. 3, is configured as push-push (x2 frequency) series tuned Colpitts oscillator. Here there are two active circuits 14b and 14bb which share common resonant circuit 12b so that at output 46 the fundamental frequency cancels and the second harmonic or the x2 frequency adds constructively. Similarly to the circuit of FIG. 1 the resonant circuit 12b here is formed by fixed inductors and two back to back connected varactor diodes. The DC control voltage is applied at tuning terminal 56 through bias choke 58. Bias chokes 60, 62 provide a voltage reference at the anode of varactors 52 and 54. Capacitance 64 allows for tuning of the x2 frequency output power level. Capacitances 66 and 68 are coupling capacitances and inductors 70 and 72 resonate with the coupling capacitances and are coupled to the active circuits 14b and 14bb and contribute to the control of the tunable bandwidth. In active circuits 14b and 14bb feedback capacitances 74, 76 and 78 and 80, respectively, determine the negative resistance characteristics of the respective active circuit 14b, 14bb. A disadvantage of this voltage controlled oscillator implementation is, again, that a high frequency voltage applied to the resonator is applied across just two varactor diodes.

Figure 4:
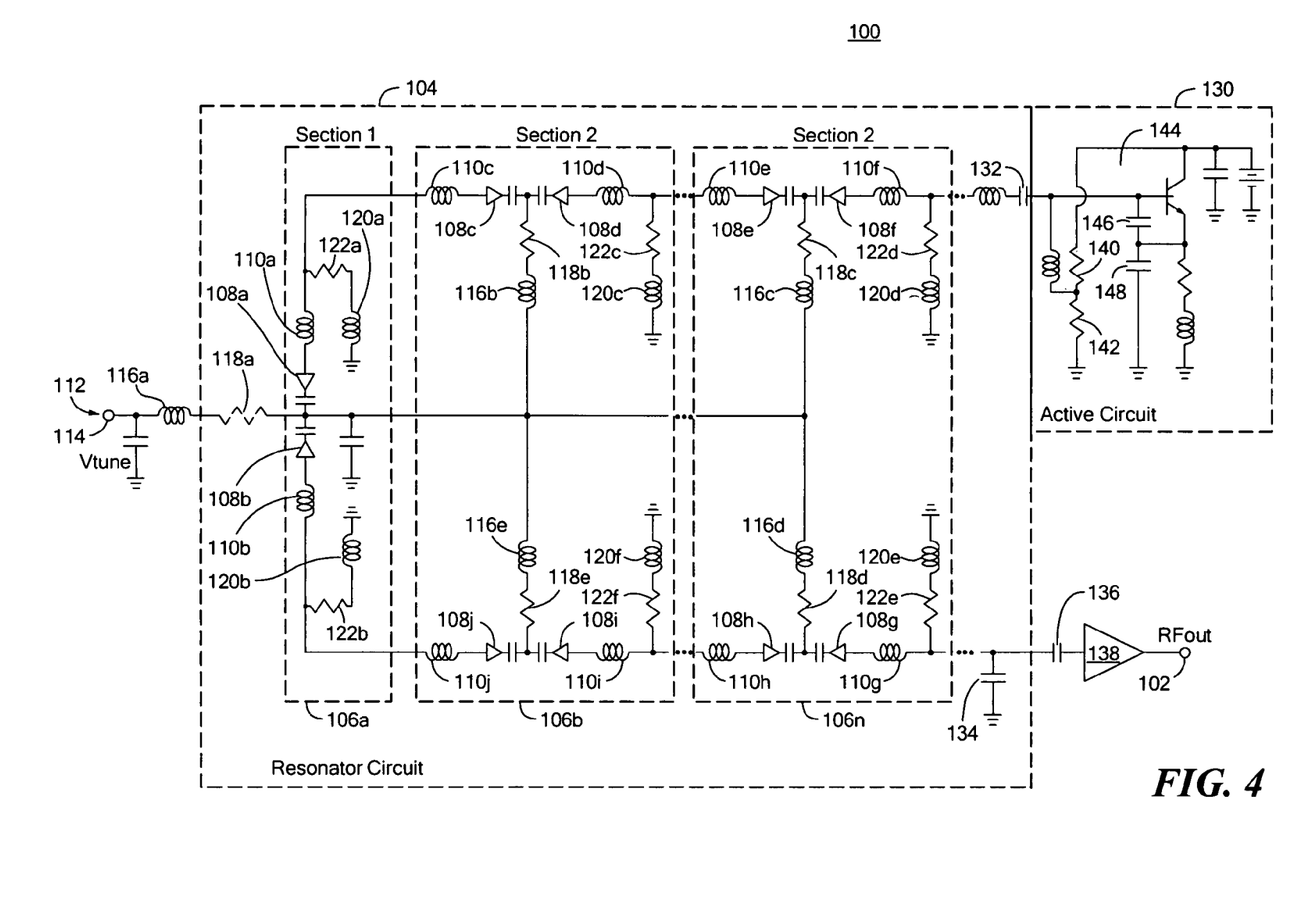
FIG. 4 is a schematic diagram of one embodiment of a single ended voltage controlled oscillator employing a series tuned Colpitts oscillator having a plurality of tunable resonators with variable capacitance and fixed inductance with reduced transistor current density and segmented transistor bank in accordance with the subject invention.
Figure 9:
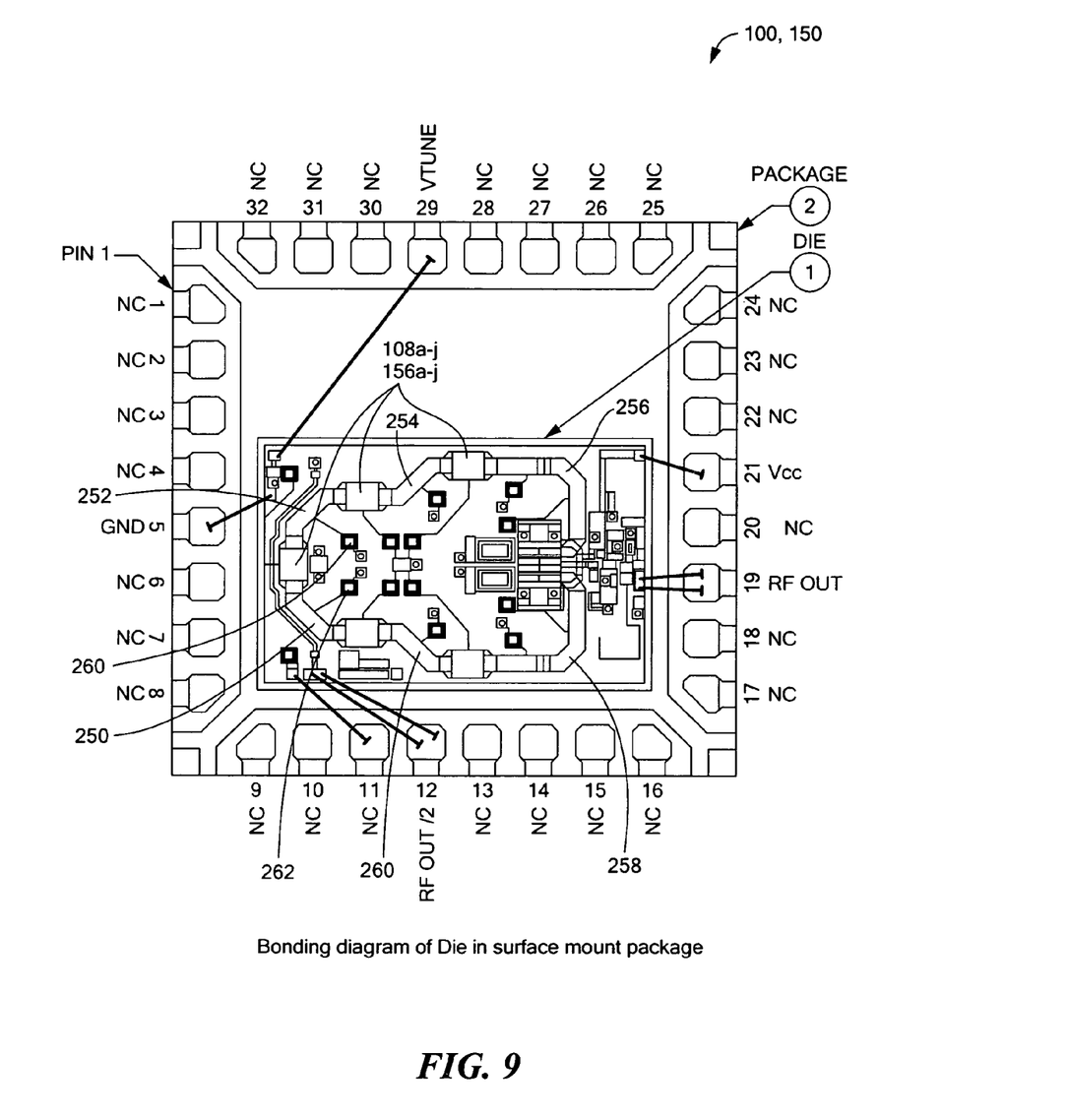
FIG. 9 is a bonding diagram plan view of the die in surface mount package as a function of a GaAs HBT process and illustrating optimal positioning of the tuning inductor connections.

In accordance with one embodiment of this invention, FIG. 4, there is a series tuned Colpitts voltage controlled oscillator 100 which provides wide bandwidth and improved phase noise performance. It includes an output terminal 102 and a resonator circuit 104 including a plurality of at least two series resonators 106a-n. Each contains electrically tunable capacitances such as back to back varactors 108a-j and fixed inductors 110a-j. Inductors 110a-j may be implemented as short transmission lines as shown in FIG. 9. The DC control circuit 112, FIG. 4, includes a frequency control terminal 114 and an inductance 116a-e and may include resistance 118a-e coupled in series between the frequency control terminal 114 and each pair of resonating varactors 108a-j. DC control circuit 112 also includes inductance 120a-f and a resistance 122a-f which provide a DC voltage reference for varactors 108a-j. Resistors 118a-f and 122a-f may be omitted if desired. Coupling between resonant circuit 104 and active circuit 130 is controlled by capacitance 132. Capacitance 134 provides a low impedance point to sample the voltage controlled oscillator output 102 through capacitance 136. An optional buffer amplifier 138 may be used to isolate resonant circuit 104 from the output 102. Resistors 140, 142 set the base current for the active device 144 and thus the oscillator operating current. Feedback capacitances 146 and 148 determine the active circuit 130 negative resistance characteristics.

In this and subsequent figures depicting other embodiments of the invention the active circuit 130 may employ any kind of suitable semiconductor device e.g. bipolar, FET, MOSFETS. Likewise the back to back pairs of PN junction varactors 108a-j shown in FIG. 4 are shown as coupled at the cathodes but each may alternatively be coupled anode to anode. Other electrically tunable capacitances could be used instead of back to back pairs of varactors, e.g. single PN junction varactor, one or more MOS varactors, one or more ferroelectric base capacitances, one or more switched capacitances that may be selected through digital control signals, MEMs based analog or digitally switched capacitances and/or field effect transistors (FET) that use the capacitance between the gate and source/drain channel of the FET. The invention as depicted in FIG. 4 and the following figures includes either the operation of the at least one transistor in the active circuit with an operating current density which is approximately 35% or less of the peak transistor transition frequency, $f_T$, operating current density for providing an improved lower phase noise output to the RF output terminal, or the active circuit may include a multi-transistor bank disposed in at least two separate sections. Each pair of sections is spaced apart to provide an improved thermal stability among the transistors without substantially increasing parasitic impedance among them for providing an improved lower phase noise output at the RF output terminal, or it may use both. Further the tuning inductance may be coupled to the electrically variable capacitances at a point where the RF voltage is at a minimum as illustrated, infra, with reference to FIG. 9. The oscillator may be implemented on a monolithic substrate of GaAs or Si. The transistor bank sections may be spaced apart at approximately 200-500μ from center to center. Separation at 215μ center to center has been found workable using a GaAs HBT process.

Figure 5:
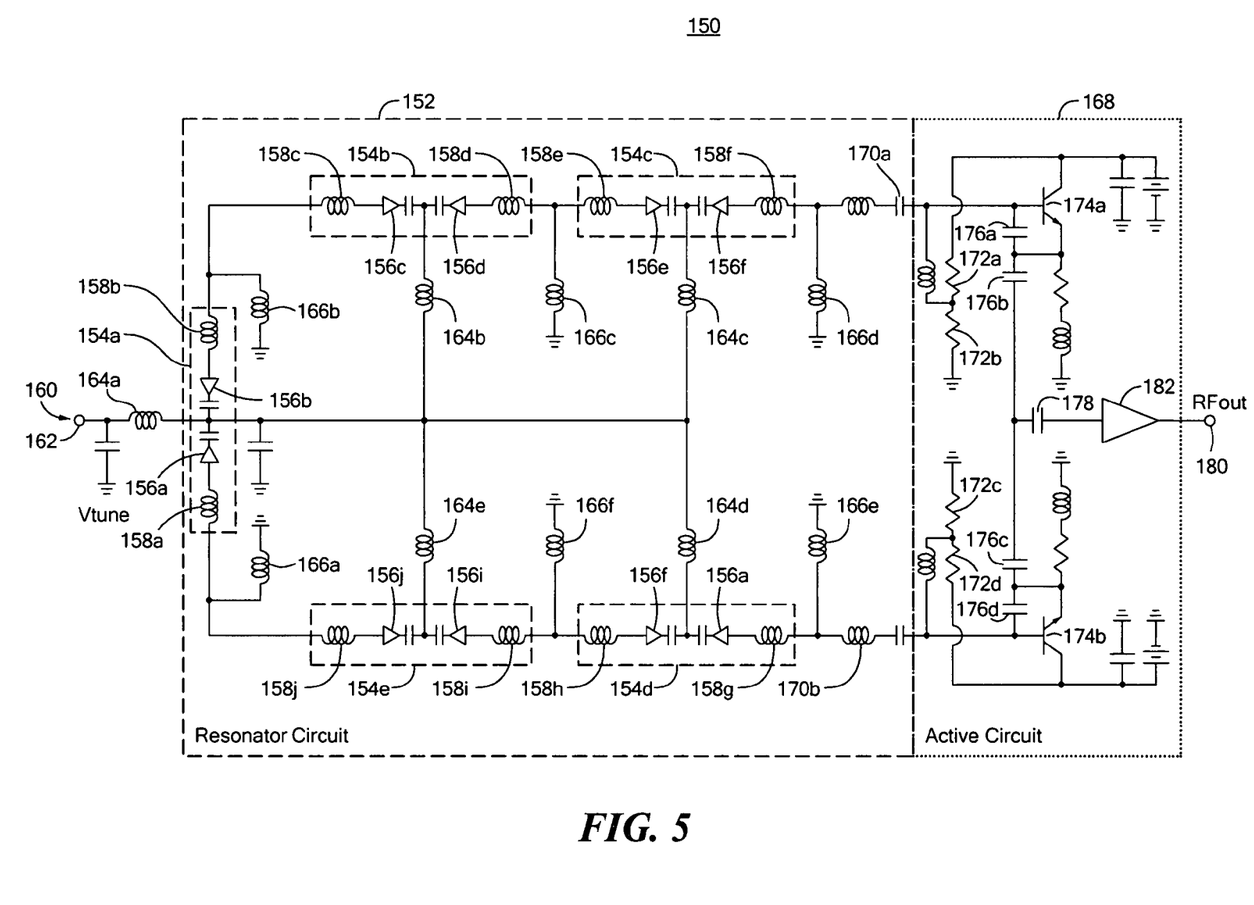
FIG. 5 is a schematic diagram of another embodiment of a voltage controlled oscillator similar to FIG. 4 but in accordance with the subject invention depicting a push-push (x2 frequency) configuration.

In another embodiment of the invention, FIG. 5, voltage controlled oscillator 150 is configured as a push-push series tune Colpitts oscillator whose resonator circuit 152 includes five tunable series resonators 154a-e. Each resonator includes back to back varactors 156a-j, each of which is respectively coupled in series with inductors 158a-j. Inductors 158a-j may be implemented as short transmission lines as referenced in FIG. 9, infra. DC control circuit 160, FIG. 5, includes a frequency control terminal 162 and inductances 164a-e coupled in series between control terminal 162 and each pair of resonator varactors 156a-j. DC control circuit 160 also includes inductances 166a-f which provide a DC voltage reference for varactors 156a-j. Coupling from resonator circuit 152 to active circuit 168 is controlled by capacitances 170a and 170b. Resistors 172a-d set the base current in the active devices, transistors 174a, 174b and thus the oscillator operating current to provide an operating current density which is approximately 35% or less of the peak transistor transition frequency, $f_T$, operating current density. Feedback capacitances 176a-d determine the negative resistance of active circuit 168. Capacitance 178 is coupled to the output terminal 180 and an optional buffer amplifier 182 may be used to isolate the active circuit from output 180. Phase noise performance with a full tuning range of voltage controlled oscillator 150 is improved in accordance with this invention by using a number, e.g. five series resonators 154a-e. The high frequency voltage generated in the active circuit 168 is divided substantially equally among series resonators 154a-e. Incorporating the fixed inductances 158a-j into each resonator makes this embodiment also a fully distributed one. That is, when both inductances and capacitances are distributed, that eases the physical implementation of the resonator, minimizing unwanted parasitic inductance and capacitance.

Again, either or both the innovations of the operating current density at 35% or less of the peak transistor transition frequency, $f_T$, operating current density and/or the segmentation of the multi-transistor bank in the active circuit to include at least two separate sections to provide improved thermal uniformity among the transistors without substantially increasing the parasitic impedance among them, provides the improved lower phase noise output at the RF output terminal which is desired.

The frequency tuning bandwidth of voltage controlled oscillator 150 or 100 is increased by incorporating a number, e.g. five series resonators 154a-e. In general as the number of series resonators increases so does the rate of reactance change versus frequency for the composite resonator circuit 152. For a given active circuit 168 and for equivalent tunable series LC resonators 154a-e the voltage controlled oscillator with the greatest number of series resonators will have the widest frequency tuning bandwidth. The number of LC series resonator sections is limited by the positive parasitic resistance of the composite resonator circuit 152. This parasitic resistance is due to the finite conductivity of the metals used in a resonator circuitry. As the number of series tunable LC series resonant sections is increased so too is the amount of positive parasitic resistance. If the positive parasitic resistance is greater than the negative resistance generated by the active circuit 168 the device will not oscillate.

Figure 6:
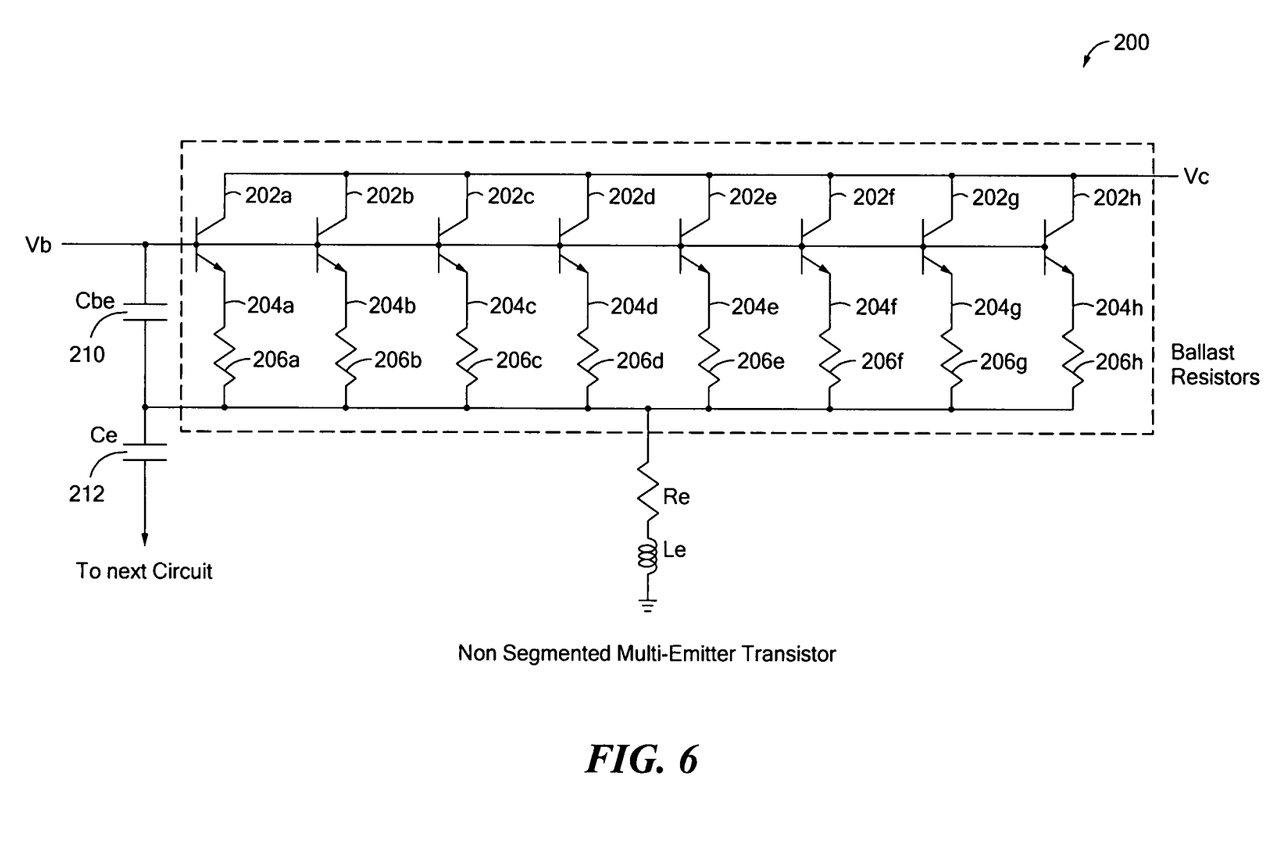
FIG. 6 is a schematic illustration of a multi-transistor bank using bipolar transistors in a multi-emitter configuration.
Figure 7:
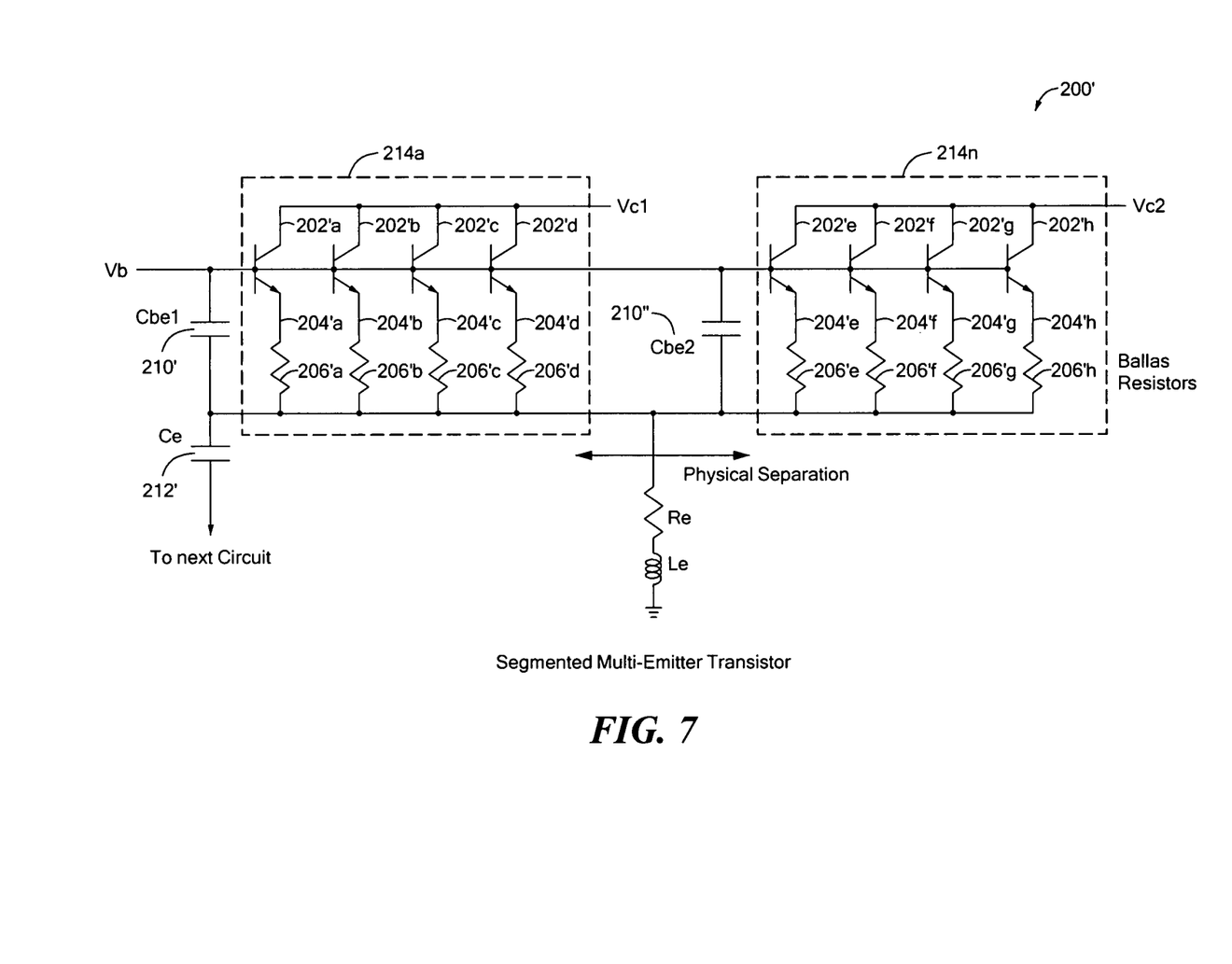
FIG. 7 is a schematic illustration of a multi-transistor bank of FIG. 6 segmented into a plurality of spaced sections according to this invention.

Segmenting the transistors in the multi-transistor bank implementing the transistor 144, FIG. 4, or 174a, b, FIG. 5, in the active circuits 130, 168, respectively, results in more consistent emitter temperature in a multi-emitter device and provides an improved noise performance. FIG. 6 shows a portion of the oscillator schematic when using a multi-transistor bank 200 with non-segmented transistors 202a-h. Each finger 204a-h of the multi-emitter transistor bank 200 includes a ballast resistor 206a-h to help eliminate current hogging. Feedback capacitances 210 and 212 are applied across the composite device. In accordance with this invention, FIG. 7, the bank of transistors 200' is segmented or separated into two or more sections 214a-n. As with respect to FIG. 6 each emitter contains a ballast resistor 206'a-h so the composite transistor is segmented into individual sections in order to improve the thermal performance. Feedback capacitances 210', 210" and 212' are segmented into banks similarly to the emitters. There are at least two banks or more and each pair of sections is spaced apart to provide the sought improved thermal uniformity among the transistors without substantially increasing parasitic impedance among them in order to provide the improved lower phase noise output at the RF output terminal. Typically a spacing of 200 to 550μ is effective and in a GaAs HBT process a 215μ center to center spacing works well. This physical separation allows for more consistent transistor temperature than if all the emitters were ganged together in a single row as in prior art oscillators. In a long row of transistors the inner devices typically will heat up more than devices on the ends. As an individual transistor element heats up its base-emitter voltage decreases and that device tends to carry more current. Due to the increased current in the middle devices the temperature continues to increase exhibiting a positive feedback behavior which results in the central device carrying even more current. This phenomenon is known a current hogging. The consequence of this is that if a particular device in a multi-transistor active circuit is carrying more current than its neighbors due to its current hogging it can generate relatively more low frequency noise than the other devices and result in poor phase noise. While this improved embodiment is shown with respect to bipolar transistor it is equally effective using any other kind of semi-conductors, e.g. FET, MOSFET.

Figure 8:
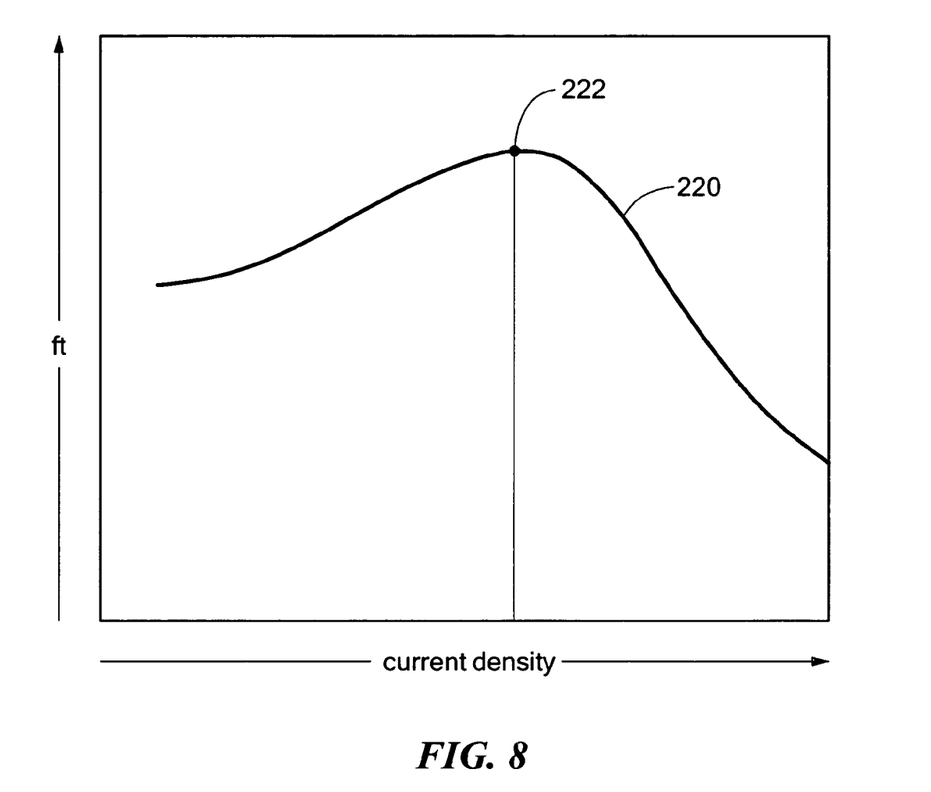
FIG. 8 is an idealized graphical representation of the transition frequency, $f_T$ vs. operating current density characteristic for a typical transistor.

In the active circuit the active device, or transistor, or transistors, operating current density is defined as the ratio of main current flowing through the transistor or transistor bank to the area of that device. It has been understood here in accordance with the invention if the active device current is operated at a greatly reduced current density it reduces low frequency noise generation in the transistor and active circuit and results in improved voltage controlled oscillator phase noise. This current density can be reduced either by reducing the operating current or increasing the area of the transistor. Reducing the operating current generally results in low output power and so heretofore has been thought undesirable. It has always been desirable to operate at peak, $f_T$, where $f_T$ is the transition frequency of the transistor which varies with current density. The $f_T$ is also referred to as the unity gain-bandwidth frequency beyond which the short circuit current gain is less than one. Typically the prior art teaches to operate at or as close as possible to the peak $f_T$ as shown in FIG. 8, where a characteristic 220 of a variation of $f_T$ with current density is shown. In accordance with this invention counter intuitively, it has been determined that operating not at the peak $f_T$, 222, or close to it but rather at 35% or below the peak $f_T$, 222, provides improved phase noise reduction. Operation at approximately 25% of peak $f_T$ has worked well.

Although in each of the embodiment in FIGS. 4 and 5 the oscillators are shown with five series resonators the same techniques can be used with a different number of series resonators more or less. In addition to the push-push series tuned Colpitts oscillator shown many other oscillator topologies are possible such as the Clapp or differential cross-coupled topologies, for example. A preferable feature is that two or more series resonators are used each with electrically tunable capacitances and each with fixed inductors resulting in reduced high frequency voltage across the tunable capacitances. The voltage controlled oscillator of this invention may be implemented in a number of processes. One preferred process is shown in FIG. 9 where the voltage controlled oscillator 100 or 150 is implemented as shown in the bonding diagram of the die in a surface mount package. In this particular embodiment the die may be Si, or GaAs in a HBT process. Here there are five back to back electrically variable capacitances, varactors 108*a-j* and 156 *a-j*. Interconnecting them are microwave waveguide conductors 250-258. Short lengths of these waveguides 250-258 may function as inductances as indicated earlier and the connection to them can be made at a point of minimum RF voltage or voltage nodes as indicated at 260 and 262.

Figure 10:
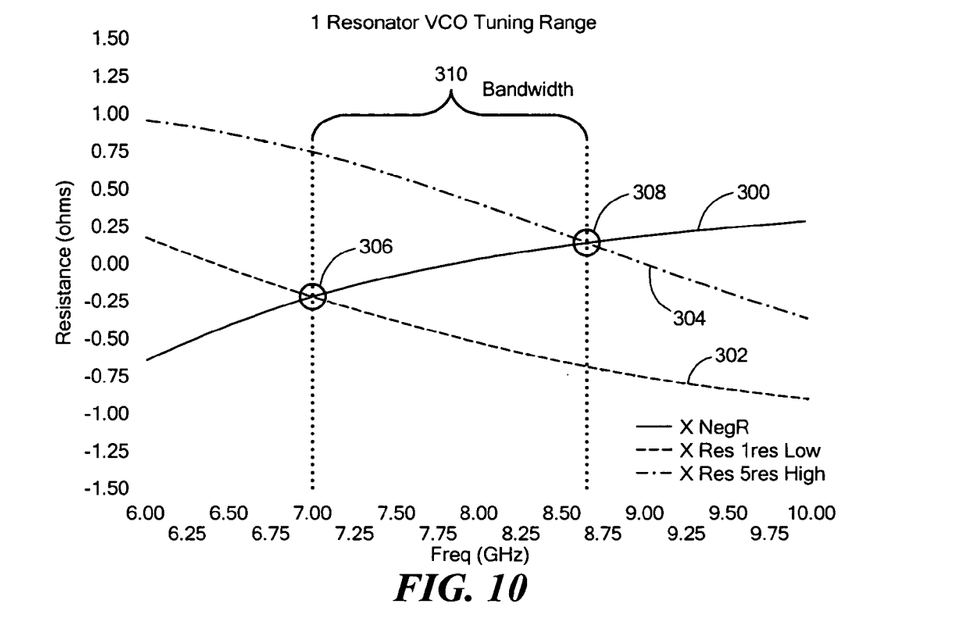
FIG. 10 is an illustration of a negative resistance analysis for a single resonator voltage controlled oscillator.
Figure 11:
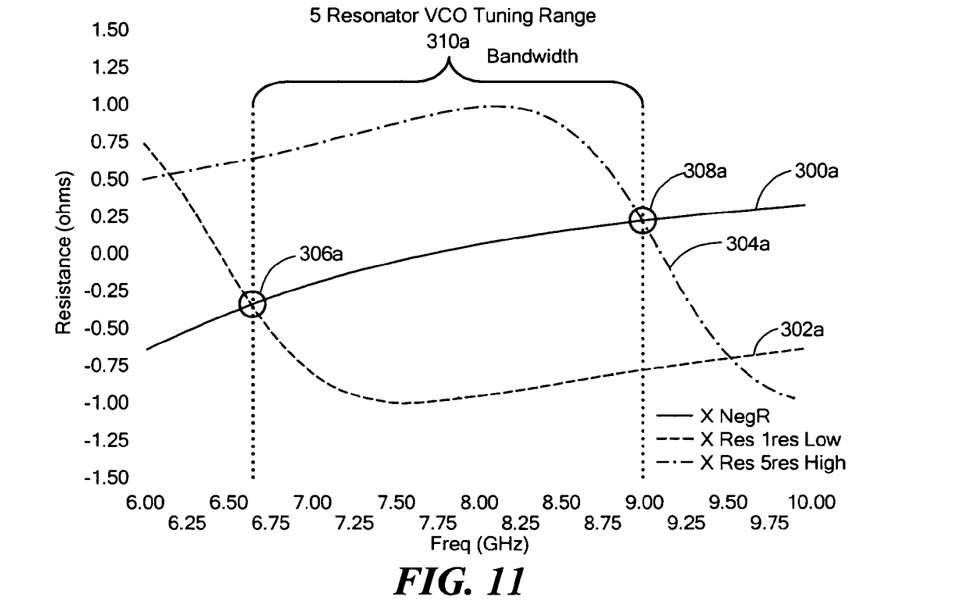
FIG. 11 is an illustration of a negative resistance analysis for a five series resonator voltage controlled oscillator.

The improved performance in accordance with this invention can be better understood with respect to FIG. 10, which shows a negative resistance analysis of an oscillator with a single tunable LC resonator and the low tuning voltage at 302 and high tuning voltage at 304 for a single series resonator configuration. Oscillation occurs at the point where the resonator reactance is equal to the negative of the active circuit reactance. For convenience FIG. 10 shows the active circuit reactance and the negative of the series resonator reactance. Thus, in FIG. 10 oscillation occurs at the frequency where the negative of the resonator circuit reactance trace intersects the active circuit reactance trace as at 306 and 308. FIG. 10 shows the two resonant circuit reactance curves representing the possible control voltage extremes 302 and 304. The oscillator frequency tuning bandwidth 310 is defined by the region in FIG. 10 between the two intersection points 306 and 308 as shown. Note that the rate of change of resonant reactance with frequency is relatively slow for this single resonator case in the prior art. In FIG. 11 there is shown another negative resistance analysis indicating the effectiveness of using multiple series resonators in accordance with this invention for increasing oscillator frequency tuning bandwidth. The same active circuit is used as in FIG. 10 but with a new resonator circuit consisting of five series tunable LC resonators identical to the single resonator used in FIG. 10. It can be seen that the oscillator frequency tuning range 310*a* has increased due to the increased rate of change in the resonator reactance with frequency.

Figure 12:
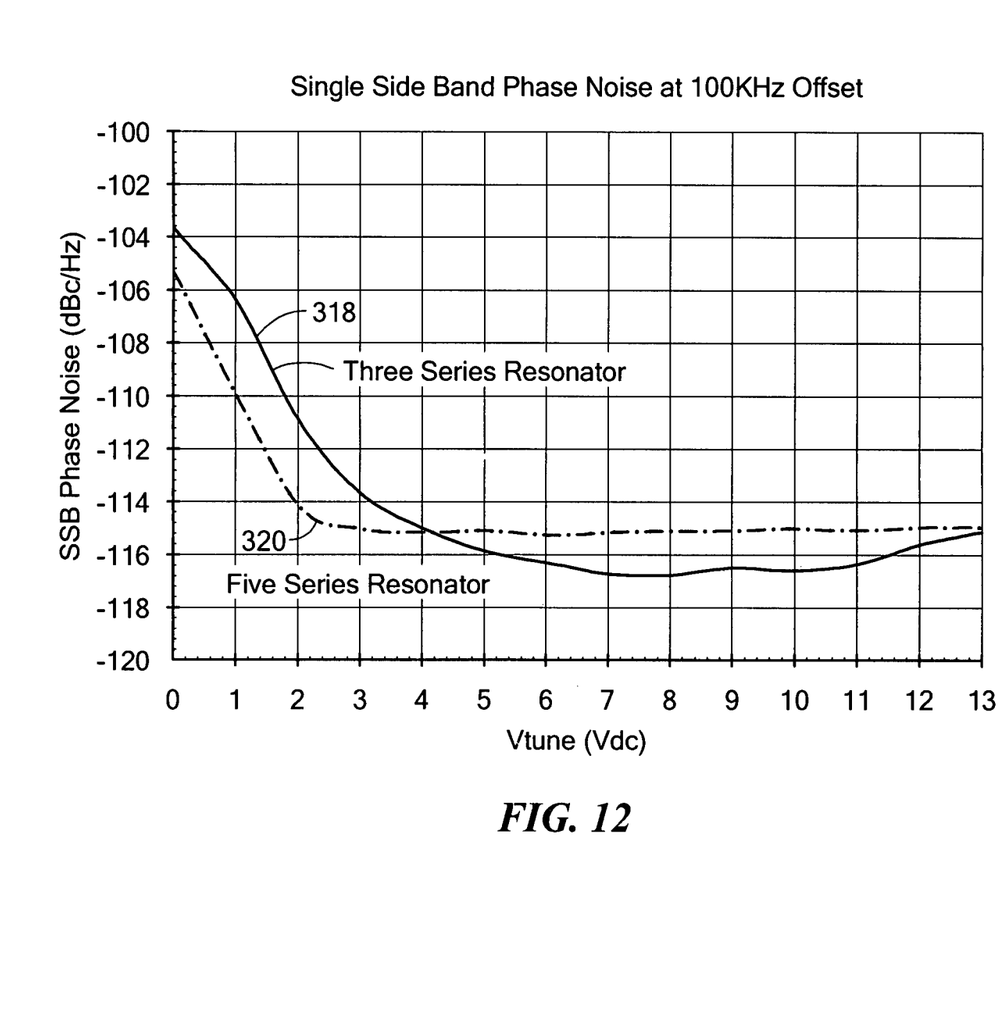
FIG. 12 is an illustration of the phase noise characteristics of a prior art voltage controlled oscillator and a voltage controlled oscillator according to this invention.

A plot of phase noise at 100 kHz offset versus DC control is shown in FIG. 12 where the improvement in phase noise at relatively low control voltage between the five series resonator 320 and a similar three series resonator 318 is shown. Thus embodiments of this invention provide a voltage controlled oscillator with improved flatter phase noise versus oscillator tuning voltage. The voltage controlled oscillator may also have its circuit realized in a monolithic fashion to benefit from the consistency of the many reactive elements, reduced size, low cost and the possibility to integrate other active or passive circuit functions on the same die.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A voltage controlled oscillator comprising:
   an RF output terminal and a DC control terminal;
   an active circuit; and
   a resonant circuit interconnected with said active circuit and including at least three series resonators each having an electrically variable capacitance and a fixed inductor;
   said active circuit including at least one transistor having an operating current density which is approximately 35% or less of a peak transition frequency ($f_T$) operating current density for providing an improved lower phase noise output at said RF output terminal.

2. The voltage controlled oscillator of claim 1 in which there are four series resonators each having a variable capacitance and a fixed inductor.

3. The voltage controlled oscillator of claim 1 in which there are five series resonators each having a variable capacitance and a fixed inductor.

4. The voltage controlled oscillator of claim 1 further including an inductance coupled in series between the DC control terminal and each of the electrically variable capacitances to adjust the frequency of the oscillator.

5. The voltage controlled oscillator of claim 1 further including an inductance and a resistance coupled in series between the DC control terminal and each of the electrically variable capacitances to adjust the frequency of the oscillator.

6. The voltage controlled oscillator of claim 4 in which said inductance is coupled to said electrically variable capacitances at a point of RF voltage minimum.

7. The voltage controlled oscillator of claim 1 in which each of said electrically variable capacitances includes a varactor.

8. The voltage controlled oscillator of claim 7 in which each of the varactors includes two diodes coupled together.

9. The voltage controlled oscillator of claim 7 in which each of said varactors includes only one diode.

10. The voltage controlled oscillator of claim 1 which is implemented on a planar monolithic substrate.

11. The voltage controlled oscillator of claim 10 in which said monolithic substrate is selected from the group of a GaAs substrate and a Si substrate.

12. The voltage controlled oscillator of claim 7 in which each of said varactors includes a p-n junction.

13. The voltage controlled oscillator of claim 7 in which each of said varactors includes a field effect transistor (FET) and includes a capacitance between the gate and a source of the FET.

14. The voltage controlled oscillator of claim 1 in which each of said electrically variable capacitances includes a ferroelectric based capacitance.

15. The voltage controlled oscillator of claim 7 in which each of said varactors includes a MEMs based capacitance.

16. The voltage controlled oscillator of claim 7 in which each of said varactors includes a switchable capacitor.

17. The voltage controlled oscillator of claim 1 in which said resonant circuit and said active circuit are configured as single ended oscillator.

18. The voltage controlled oscillator of claim 10 in which the monolithic substrate is disposed in a surface mount package.

19. The voltage controlled oscillator of claim 1 in which said resonant circuit and said active circuit are configured as a push-push oscillator.

20. The voltage controlled oscillator of claim 1 in which said resonant circuit and said active circuit are configured as a Colpitts oscillator.

21. The voltage controlled oscillator of claim 1 in which said active circuit includes a bipolar transistor.

22. The voltage Controlled oscillator of claim 1 in which said active circuit includes a field effect transistor.

23. A voltage controlled oscillator comprising:
a RF output terminal and a DC control terminal;
an active circuit; and
a resonant circuit interconnected with said active circuit and including a plurality of series resonators each having an electrically variable capacitance and fixed inductor;
said active circuit including a multi-transistor bank disposed in at least two separate sections, each pair of sections spaced apart to provide improved thermal uniformity among transistors of the multi-transistor bank without substantially increasing parasitic impedance among them for providing an improved lower phase noise output at said RF output terminal.

24. The voltage controlled oscillator of claim 23 in which there are three series resonators each having a variable capacitance and a fixed inductor.

25. The voltage controlled oscillator of claim 23 in which there are four series resonators each having a variable capacitance and a fixed inductor.

26. The voltage controlled oscillator of claim 23 in which there are five series resonators each having a variable capacitance and a fixed inductor.

27. The voltage controlled oscillator of claim 23 said sections are spaced apart approximately 200-500μ from section center to center.

28. The voltage controlled oscillator of claim 23 in which said sections include bipolar transistors and are connected in common emitter configuration.

29. The voltage controlled oscillator of claim 27 in which said sections include bipolar transistors and are spaced 215μ from section center to center with said transistor bank made with a GaAs HBT process.

30. The voltage controlled oscillator of claim 23 further including an inductance coupled in series between the DC control terminal and each of the electrically variable capacitances to adjust the frequency of the oscillator.

31. The voltage controlled oscillator of claim 23 further including an inductance and a resistance coupled in series between the DC control terminal and each of the electrically variable capacitances to adjust the frequency of the oscillator.

32. The voltage controlled oscillator of claim 30 in which said inductance is coupled to said electrically variable capacitances at a point of RF voltage minimum.

33. The voltage controlled oscillator of claim 23 in which each of said electrically variable capacitances includes a varactor.

34. The voltage controlled oscillator of claim 33 in which each of the varactors includes two diodes coupled together.

35. The voltage controlled oscillator of claim 33 in which each of said varactors includes only one diode.

36. The voltage controlled oscillator of claim 23 which is implemented on a planar monolithic substrate.

37. The voltage controlled oscillator of claim 36 in which the monolithic substrate is selected from the group of a GaAs substrate and a Si substrate.

38. The voltage controlled oscillator of claim 33 in which each of said varactors includes a p-n junction.

39. The voltage controlled oscillator of claim 33 in which each of said varactors includes a field effect transistor (FET) and includes a capacitance between the gate and a source of the FET.

40. The voltage controlled oscillator of claim 23 in which each of said electrically variable capacitances includes a ferroelectric based capacitance.

41. The voltage controlled oscillator of claim 33 in which each of said varactors includes a MEMs based capacitance.

42. The voltage controlled oscillator of claim 33 in which each of said varactors includes a switchable capacitor.

43. The voltage controlled oscillator of claim 23 in which said resonant circuit and said active circuit are configured as single ended oscillator.

44. The voltage controlled oscillator of claim 36 in which the monolithic substrate is disposed in a surface mount package.

45. The voltage controlled oscillator of claim 23 in which said resonant circuit and said active circuit are configured as a push-push oscillator.

46. The voltage controlled oscillator of claim 23 in which said resonant circuit and said active circuit are configured as a Colpitts oscillator.

47. The voltage controlled oscillator of claim 23 in which said active circuit includes a bipolar transistor.

48. The voltage controlled oscillator of claim 23 in which said active circuit includes a field effect transistor.

49. A voltage controlled oscillator comprising:

an RF output terminal and a DC control terminal;

an active circuit; and a resonant circuit interconnected with said active circuit and including a plurality of series resonators each having an electrically variable capacitance and fixed inductor;

said active circuit including at least one transistor having an operating current density which is approximately 35% or less of a peak transition frequency ($f_T$) operating current density;

said active circuit further including a multi-transistor bank disposed in at least two separate sections, each pair of sections spaced apart to provide improved thermal uniformity among transistors of the multi-transistor bank without substantially increasing parasitic impedance among them for providing an improved lower phase noise output at said RF output terminal.

\* \* \* \* \*